(12) United States Patent
Stadlmair et al.

(10) Patent No.: US 11,500,003 B2
(45) Date of Patent: Nov. 15, 2022

(54) INTEGRATED CIRCUIT AND MEASUREMENT METHOD

(71) Applicant: NXP B.V., Eindhoven (NL)

(72) Inventors: Rainer Stadlmair, Deutschfeistritz (AT); Franz Amtmann, Graz (AT)

(73) Assignee: NXP B.V., Eindhoven (NL)

( * ) Notice: Subject to any disclaimer, the term of this patent is extended or adjusted under 35 U.S.C. 154(b) by 202 days.

(21) Appl. No.: 16/944,435

(22) Filed: Jul. 31, 2020

(65) Prior Publication Data

US 2021/0063455 A1 Mar. 4, 2021

(30) Foreign Application Priority Data

Aug. 27, 2019 (EP) .................................... 19193888

(51) Int. Cl.
*G01R 27/26* (2006.01)
*G06K 19/07* (2006.01)

(52) U.S. Cl.
CPC ..... *G01R 27/2605* (2013.01); *G06K 19/0723* (2013.01)

(58) Field of Classification Search
CPC ............ G01R 27/2605; G06K 19/0723; G09F 3/0335; G09F 3/0376; G08B 13/2431
USPC .................................................. 324/658–690
See application file for complete search history.

(56) References Cited

U.S. PATENT DOCUMENTS

| 4,642,555 | A | 2/1987 | Swartz et al. | |
| 8,917,102 | B2 | 12/2014 | Brodin et al. | |
| 2009/0108914 | A1 | 4/2009 | Zhang et al. | |
| 2011/0074445 | A1* | 3/2011 | Nascimento | H03K 17/955 324/676 |
| 2013/0271163 | A1* | 10/2013 | Brunet | H03K 17/962 324/679 |
| 2015/0338363 | A1* | 11/2015 | Dean, Jr. | G01N 27/221 324/663 |
| 2020/0082238 | A1 | 3/2020 | Landauer et al. | |

FOREIGN PATENT DOCUMENTS

| CN | 108519521 A | 9/2018 |
| DE | 1960770 C3 | 4/1978 |
| WO | 2018/172964 A1 | 9/2018 |
| WO | 2019/144303 A1 | 8/2019 |

* cited by examiner

*Primary Examiner* — Farhana A Hoque

(57) ABSTRACT

In accordance with a first aspect of the present disclosure, an integrated circuit is provided, comprising a current source and a reference capacitor, the integrated circuit being configured to: inject, using said current source, a first current in an external measurement capacitor and determine a first amount of time within which a resulting voltage on the measurement capacitor reaches a voltage threshold; inject, using said current source, a second current in the reference capacitor and determine a second amount of time within which a resulting voltage on the reference capacitor reaches said voltage threshold; detect a change of the capacitance on the measurement capacitor using a difference between the first amount of time and the second amount of time. In accordance with a second aspect of the present disclosure, a corresponding measurement method is conceived.

20 Claims, 4 Drawing Sheets

INTEGRATED CIRCUIT AND MEASUREMENT METHOD

CROSS-REFERENCE TO RELATED APPLICATIONS

This application claims priority under 35 U.S.C. § 119 to European Patent Application No. 19193888.5, filed on Aug. 27, 2019, the contents of which are incorporated by reference herein.

FIELD

The present disclosure relates to integrated circuit. Furthermore, the present disclosure relates to a measurement method.

BACKGROUND

Capacitance-based measurement systems and methods may be used in various applications. For instance, they may be used in tamper detection devices. Although many tamper detection devices comprise resistor-based measurement systems, it may be beneficial to use capacitance-based measurement systems. Since it is much easier to reestablish a galvanic connection than to restore a capacitance value, capacitance-based measurement systems may enable a more reliable tamper detection. Capacitance-based measurement systems and methods may also be used in other fields, for example for measuring physical parameters such as humidity. The presently disclosed system and method may be applied both in tamper detection devices and in other kinds of devices that require accurate capacitance measurements.

As an example, capacitance-based tamper detection devices comprise an integrated circuit (i.e., a chip) which is coupled to a capacitor. The integrated circuit may for example be included in a radio frequency identification (RFID) tag or a near field communication (NFC) tag. In operation, changes in the capacitance on the capacitor may be indicative of a tampering attempt on the product, and information indicating the same can be stored in the integrated circuit. Subsequently, this information can be read out by an RFID reader or an NFC reader.

For example, the capacitor can be a plate capacitor consisting of two metal foils and a plastic foil in the middle as the dielectric. Such a capacitor can be fixed to a bottle closure to protect an expensive bottle of wine against tampering, and once the bottle is opened the capacitor is destroyed or at least the capacitance value is altered significantly. Information indicating the same can be stored in the tag's integrated circuit (IC). Then the RFID tag fixed to the capacitor can be read out with a mobile phone, and it may be displayed on the phone that someone has manipulated the bottle. In another example, the tamper detection device may be applied to envelopes, the paper being the dielectric. Then, it can be detected if the envelope was altered or manipulated.

It is important that capacitance measurements are as accurate as possible. The presently disclosed system and method facilitate increasing this accuracy.

SUMMARY

In accordance with a first aspect of the present disclosure, an integrated circuit is provided, comprising a current source and a reference capacitor, the integrated circuit being configured to: inject, using said current source, a first current in an external measurement capacitor and determine a first amount of time within which a resulting voltage on the measurement capacitor reaches a voltage threshold; inject, using said current source, a second current in the reference capacitor and determine a second amount of time within which a resulting voltage on the reference capacitor reaches said voltage threshold; detect a change of the capacitance on the measurement capacitor using a difference between the first amount of time and the second amount of time.

In one or more embodiments, the integrated circuit is further configured to inject the first current in the measurement capacitor simultaneously with injecting the second current in the reference capacitor.

In one or more embodiments, the first current is a configurable current and the second current is a constant current.

In one or more embodiments, the first current is configured such that a voltage slope on the measurement capacitor is substantially the same as a voltage slope on the reference capacitor.

In one or more embodiments, the integrated circuit is configured to determine a value of the first current when the integrated circuit is calibrated.

In one or more embodiments, the integrated circuit is configured to store the determined value of the first current in a non-volatile memory of the integrated circuit.

In one or more embodiments, the determined value of the first current is a value that results in a minimal difference between the first amount of time and the second amount of time, said minimal difference being stored as a calibration offset in the non-volatile memory.

In one or more embodiments, the integrated circuit further comprises counters for determining the first amount of time and the second of time.

In one or more embodiments, said counters are configured to start counting when a trigger voltage is reached and to stop counting when the voltage threshold is reached.

In one or more embodiments, the integrated circuit is further configured to: determine a third amount of time within which a resulting voltage on the measurement capacitor reaches a further voltage threshold; determine a fourth amount of time within which a resulting voltage on the reference capacitor reaches said further voltage threshold; detect the change of the capacitance on the measurement capacitor using a difference between the third amount of time and the fourth amount of time.

In one or more embodiments, a radio frequency identification (RFID) tag or a near field communication (NFC) tag comprises an integrated circuit of the kind set forth.

In one or more embodiments, a measurement system comprises an integrated circuit of the kind set forth and the measurement capacitor.

In one or more embodiments, a tamper detection system comprises a measurement system of the kind set forth.

In accordance with a second aspect of the present disclosure, a measurement method is conceived, comprising: injecting, by means of a current source in an integrated circuit, a first current in a measurement capacitor, and determining a first amount of time within which a resulting voltage on the measurement capacitor reaches a voltage threshold; injecting, by means of said current source, a second current in a reference capacitor and determining a second amount of time within which a resulting voltage on the reference capacitor reaches said voltage threshold; detecting, by the integrated circuit, a change of the capacitance on the measurement capacitor using a difference between the first amount of time and the second amount of time.

In one or more embodiments, the integrated circuit injects the first current in the measurement capacitor simultaneously with injecting the second current in the reference capacitor.

DESCRIPTION OF DRAWINGS

Embodiments will be described in more detail with reference to the appended drawings, in which.

DESCRIPTION OF EMBODIMENTS

Figure 1:
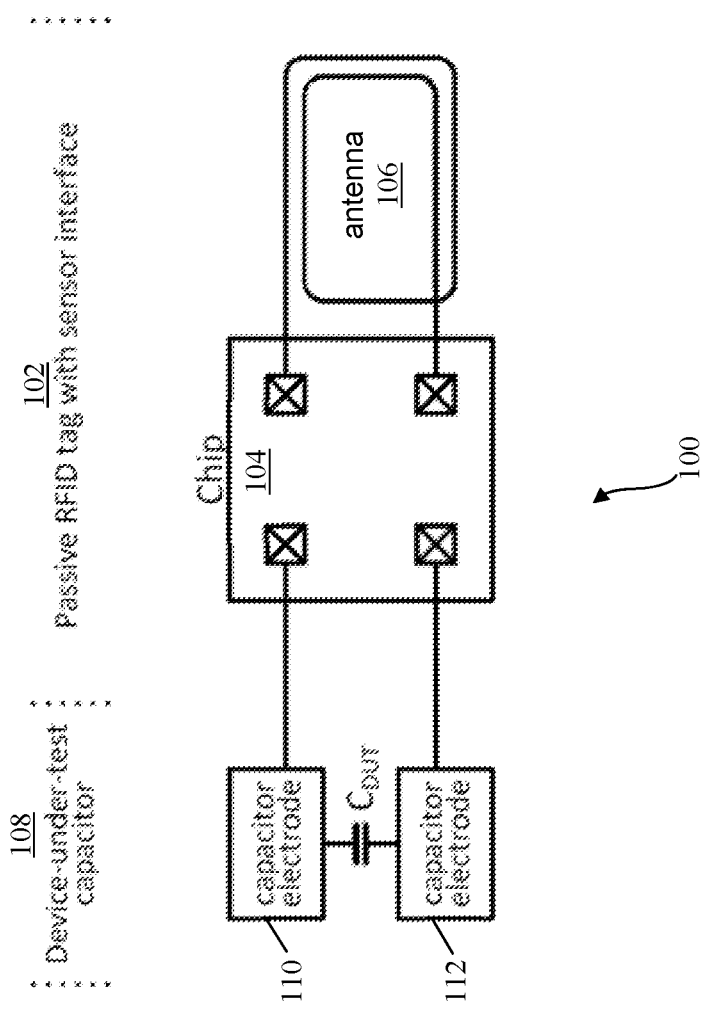
FIG. 1 shows an example of a measurement system.

FIG. 1 shows an example of a measurement system 100. The system 100 comprises a passive RFID tag with a sensor interface 102 and a device-under-test capacitor 108 (i.e., a measurement capacitor). As mentioned above, tamper detection devices often comprise an integrated circuit (i.e., a chip) which is coupled to a capacitor. The same may be true for sensors of physical parameters such as humidity. The integrated circuit may for example be included in a radio frequency identification (RFID) tag or a near field communication (NFC) tag. In operation, changes in the capacitance on the capacitor may be indicative of a tampering attempt on the product or a change of sensed physical parameter, and information indicating the same can be stored in the integrated circuit. Subsequently, this information can be read out by an RFID reader or an NFC reader. Alternatively, a reader may trigger a tag to perform a measurement on the device-under-test capacitor 108 by sending a command to said tag; subsequently the tag may transmit the measurement result back to the reader without storing it in the integrated circuit. Changes in the capacitance can be detected by measuring the voltage slope on the capacitor. When the capacitance value is altered due to tampering or a change of a physical parameter, the voltage slope changes because the injected current during measurement remains substantially the same: $\Delta V/\Delta t = I/C$. The passive RFID tag 102 shown in FIG. 1 contains an integrated circuit 104 (i.e., a chip) of the kind set forth and an antenna 106. Furthermore, the device-under-test capacitor 108 is an example of a measurement capacitor of the kind set forth. An external RFID reader (not shown) may be configured to read out data from the RFID tag through the antenna 106 of the RFID tag 102. It is noted that the coupling between the capacitor and the chip may be referred to as a sensor interface.

The measurement of changes in the capacitance on the device-under-test capacitor 108 makes use of charging currents and voltage references. However, these charging currents and voltage references may be susceptible to variations (i.e., tolerances), for example process, voltage, temperature and time-related variations, which exist between different integrated circuits. These variations limit the accuracy that can be achieved by the measurement. The presently disclosed system and method facilitate increasing the measurement accuracy.

Figure 2:
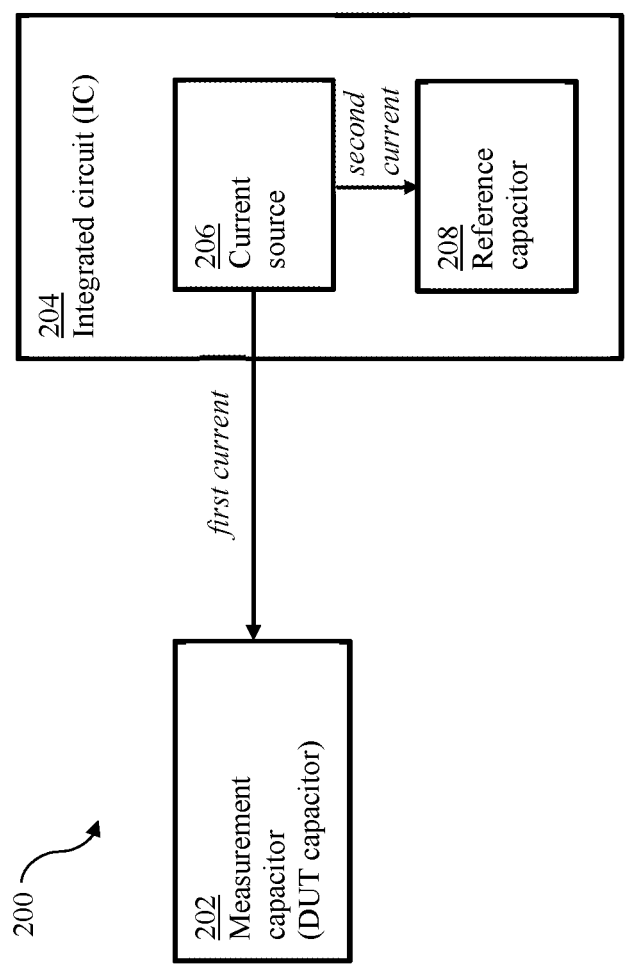
FIG. 2 shows an illustrative embodiment of a measurement system.

FIG. 2 shows an illustrative embodiment of a measurement system 200. The measurement system 200 comprises a measurement capacitor 202 (i.e., a device-under-test capacitor) and an integrated circuit 204. The integrated circuit 204 comprises a current source 206 and a reference capacitor 208. The measurement capacitor 202 may be comprised in or attached to an external product (not shown), for example a bottle closure, which can be tampered with, or it may be configured to sense a physical or environmental parameter. In accordance with the present disclosure, the integrated circuit 204 is configured to inject, using the current source 206, a first current in the measurement capacitor 202 and to determine a first amount of time within which a resulting voltage on the measurement capacitor 202 reaches a voltage threshold. Furthermore, the integrated circuit 204 is configured to inject, using the same current source 206, a second current in the reference capacitor 208 and to determine a second amount of time within which a resulting voltage on the reference capacitor 208 reaches the same threshold voltage. Furthermore, the integrated circuit 204 is configured to detect a change of the capacitance on the measurement capacitor using a difference between the first amount of time and the second amount of time.

Figure 3:
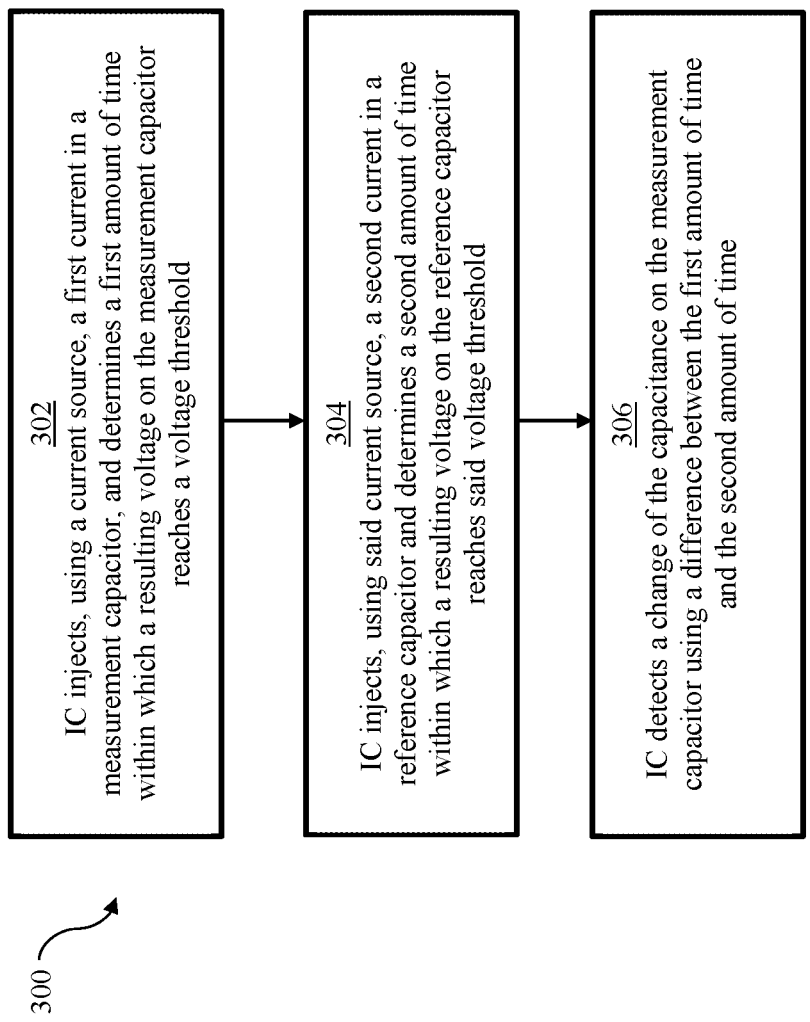
FIG. 3 shows an illustrative embodiment of a measurement method.

In this way, the accuracy of the capacitance measurement can be increased. In particular, a differential measurement approach is applied, which cancels out process, voltage, temperature and time-related variations, because both measurements are affected in the same way by said variations. Accordingly, two measurement paths use currents from a common current source: the external measurement capacitor 202 is charged through a first measurement path and the internal reference capacitor 208 is charged through a second measurement path. Since both measurements derive their measurement currents from the same source current, changes in the measurement current will affect both measurements in the same way. The same is true for the voltage threshold. Therefore, these effects cancel each other out. The measurement of the capacitance on the measurement capacitor 202 and the reference capacitor 208 is carried out by determining the amount of time needed to reach the voltage threshold. By comparing the amount of time needed by the measurement capacitor 202 with the amount of time needed by the reference capacitor 208, a change of the capacitance on the measurement capacitor 202 can easily be detected, because the capacitance on the reference capacitor 208 within the IC 204 remains substantially the same in the sense that it is not affected by the external events that should be detected (e.g., tampering or changes of physical parameters). For instance, if the difference is below a predefined threshold, it will be assumed that the capacitance on the measurement capacitor has not changed, and if the difference is above the predefined threshold, it will be assumed that the capacitance on the measurement capacitor has changed. FIG. 3 shows an illustrative embodiment of a measurement method 300. The method 300 comprises the following steps. At 302, the integrated circuit (IC) injects, using a current source, a first current in a measurement capacitor, and determines a first amount of time within which a resulting voltage on the measurement capacitor reaches a voltage threshold. At 304, the IC injects, using the same current source, a second current in a reference capacitor and determines a second amount of time within which a resulting voltage on the reference capacitor reaches the same voltage threshold. Furthermore, at 306, the IC detects a change of the capacitance on the measurement capacitor using a difference between the first amount of time and the second amount of time. These steps may be carried out or controlled by a controller of the integrated circuit, for example. As explained above, in this way, the accuracy of the capacitance measurement can be increased.

In one or more embodiments, the integrated circuit is configured to inject the first current in the measurement capacitor simultaneously with injecting the second current in the reference capacitor. By charging the measurement capacitor and the reference capacitor at the same time, the measurement system may become invariant to current changes or noise coupling over time. Thus, the accuracy of the capacitance measurement can be further increased.

In one or more embodiments, the first current is a configurable current and the second current is a constant current. In other words, the first current may be adjustable, which facilitates matching the charging slopes of the internal capacitor (i.e. the reference capacitor) and the external capacitor whose capacitance should be measured (i.e., the measurement capacitor). Thus, in one or more embodiments, the first current is configured such that a voltage slope on the measurement capacitor is substantially the same as a voltage slope on the reference capacitor. In this way, the accuracy of the capacitance measurement may be further increased. In a practical and effective implementation, the value of the first current is determined when the integrated circuit is calibrated. Furthermore, in one or more embodiments, the determined value of the first current is stored in a non-volatile memory of the integrated circuit. This facilitates retrieving said determined value when power has been down. It is noted that, since a tag may be a device which is powered by the field, power may only be available for brief periods. Furthermore, in one or more embodiments, the determined value of the first current is a value that results in a minimal difference between the first amount of time and the second amount of time, wherein said minimal difference is stored as a calibration offset in the non-volatile memory. In this way, the accuracy of the capacitance measurement may be further increased. In particular, the calibration offset may reflect a quantization error which is caused by a finite granularity of the adjustable current. Thus, a calibration step may be performed to find the correct current setting needed to match the measurement slopes (i.e., the charging slopes or voltage slopes of the respective capacitors) and to detect the quantization error caused by the finite granularity of the adjustable current. In a practical and effective implementation, the integrated circuit further comprises counters for determining the first amount of time and the second amount of time. Furthermore, in one or more embodiments, said counters start counting when a trigger voltage is reached and stop counting when the voltage threshold is reached. As will be explained below with reference to FIG. 4, waiting with counting until a trigger voltage is reached mitigates inaccuracies of the ground level and thus further improves the measurement.

In one or more embodiments, the integrated circuit is further configured to determine a third amount of time within which a resulting voltage on the measurement capacitor reaches a further voltage threshold, to determine a fourth amount of time within which a resulting voltage on the reference capacitor reaches said further voltage threshold, and to detect the change of the capacitance on the measurement capacitor using a difference between the third amount of time and the fourth amount of time. In this way, the voltage slopes of the measurement capacitor and the reference capacitor can be segmented, which may further increase the measurement accuracy. In particular, the further voltage threshold may be an intermediate voltage threshold between the trigger voltage and the (final) voltage threshold.

Thereby, two segments are created. The skilled person will appreciate that more segments can be created by extending this embodiment in the sense that further intermediate threshold voltages may be used. In that case, further amounts of time will be compared with each other, in particular the amounts of time within which a resulting voltage—i.e., a voltage resulting from the injected first and second currents—on the respective capacitors reaches the further intermediate threshold voltages. It is noted that the principle of segmentation has been described in the context of tamper detection in the European patent application titled "System and method for detecting tampering with a product", application Ser. No. 18/192,899.5, filed on 6 Sep. 2018.

More specifically, segmentation can be realized by using different threshold voltages (e.g., start, mid and end voltage). The currents injected in the respective capacitors remains the same, but the counter values may be read out multiple times. In this way, the voltages slopes are segmented. In particular, if the threshold voltages are equally spaced, one would expect equal counter values for each of the voltage slopes. By means of comparators it can be detected whether specific threshold voltages are reached. In particular, the comparators may be configured to take different threshold voltages (i.e., reference voltages) as an input, or additional comparators may be provided that take a specific intermediate threshold voltage as an input.

Figure 4:
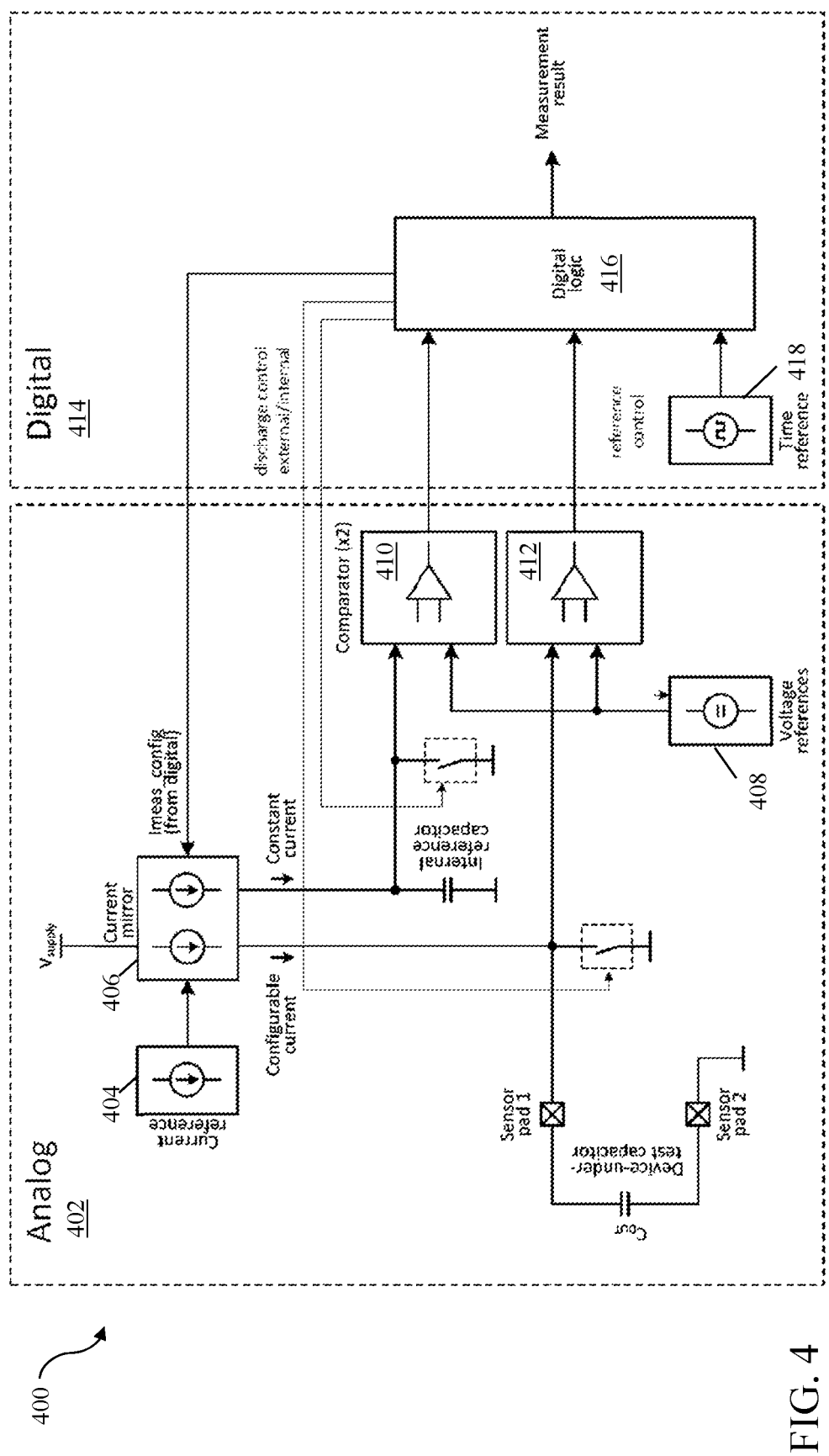
FIG. 4 shows another illustrative embodiment of a measurement system.

FIG. 4 shows another illustrative embodiment of a measurement system 400. The system 400 can be divided into an analog domain 402 and a digital domain 414. The analog domain 402 contains the measurement capacitor (i.e., the device-under-test capacitor) and the analog components of the integrated circuit, which are coupled to the measurement capacitor through sensor pads. The digital domain 414 contains the digital components of the integrated circuit. The analog domain 402 includes a current reference 404, a current mirror 406 connected to a supply voltage, voltage references 408 and comparators 410, 412. The current reference 404 and the current mirror 406 implement a current source of the kind set forth. The digital domain 414 contains digital logic 416 and a time reference 418. The integrated circuit can be in a calibration state and in a measurement state. In the calibration state, the integrated circuit is being calibrated. More specifically, in this state, the current setting for the measurement capacitor is determined, and the calibration offset is determined. In the measurement state, a change of the capacitance on the measurement capacitor is detected.

In a practical and effective implementation, the integrated circuit may operate as follows in the measurement state. The measurement may be started by discharging both capacitors to zero. Once the discharge switch is released, the internal reference capacitor will be charged by the reference current (i.e., the second current), whereas the external capacitor will be charged with a previously defined external current (i.e., the first current determined in the calibration state). Once a certain reference voltage is reached (i.e., the trigger voltage), a counter will start counting until a final reference voltage is reached (i.e., the voltage threshold). For both measurement paths independent counters are used. Not starting the counter simultaneously with releasing the discharge switch mitigates the inaccuracies of the ground level and thus further improves the measurement. Since both measurements derive their measurement currents from the same source current, changes in the measurement current will affect both measurements in the same way. The same is true for the voltage reference. Therefore, those effects cancel each other out. Additionally, multiple reference voltages (i.e., further voltage thresholds) can be chosen to further segment the measurement slope. When the measurement has finished, the difference between both counter values plus the calibration offset can be evaluated. A change detection threshold can be defined which indicates for which counter difference the capacitance on the measurement capacitor is assumed to have changed. Due to not perfectly matching components, only a certain resolution can be achieved, and the change detection threshold should be chosen higher than the minimum achievable accuracy.

In a practical and effective implementation, the integrated circuit may operate as follows in the calibration state. During the calibration, a measurement is performed, and the measurement current is adjusted until the difference between the two counters is minimal. It is noted that a successive approximation algorithm will give the least amount of measurement steps needed to find the minimum of the difference between the two counters. The current setting for charging the external measurement capacitor (DUT) is stored in a non-volatile memory and the difference value between the two counters is stored as well. This difference may be used as a calibration offset to compensate the quantization error due to the finite amount of available current settings.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 measurement system
102 RFID tag with sensor interface
104 chip (integrated circuit)
106 antenna
108 device-under-test (DUT) capacitor
110 capacitor electrode
112 capacitor electrode
200 measurement system
202 measurement capacitor (DUT capacitor)
204 integrated circuit (IC)
206 current source
208 reference capacitor
300 measurement method
302 IC injects, using a current source, a first current in a measurement capacitor comprised in or attached to a product, and determines a first amount of time within which a resulting voltage on the measurement capacitor reaches a voltage threshold
304 IC injects, using said current source, a second current in a reference capacitor and determines a second amount of time within which a resulting voltage on the reference capacitor reaches said voltage threshold
306 IC detects a change of the capacitance on the measurement capacitor using a difference between the first amount of time and the second amount of time
400 measurement system
402 analog domain
404 current reference
406 current mirror
408 voltage references
410 comparator
412 comparator
414 digital domain
416 digital logic
418 time reference

The invention claimed is:

1. An integrated circuit comprising a current source and a reference capacitor, the integrated circuit being configured to:
    inject, using said current source, a first current in an external measurement capacitor and determine a first amount of time within which a resulting voltage on the measurement capacitor reaches a voltage threshold;
    inject, using said current source, a second current in the reference capacitor and determine a second amount of time within which a resulting voltage on the reference capacitor reaches said voltage threshold;
    detect a change of the capacitance on the measurement capacitor using a difference between the first amount of time and the second amount of time, wherein the first amount of time is measured independently of the second amount of time.

2. The integrated circuit of claim 1, further being configured to inject the first current in the measurement capacitor simultaneously with injecting the second current in the reference capacitor.

3. The integrated circuit of claim 1, wherein the first current is a configurable current and the second current is a constant current.

4. The integrated circuit of claim 1, wherein the first current is configured such that a voltage slope on the measurement capacitor is substantially the same as a voltage slope on the reference capacitor.

5. The integrated circuit of claim 1, being configured to determine a value of the first current when the integrated circuit is calibrated.

6. The integrated circuit of claim 5, being configured to store the determined value of the first current in a non-volatile memory of the integrated circuit.

7. The integrated circuit of claim 6, wherein the determined value of the first current is a value that results in a minimal difference between the first amount of time and the second amount of time, said minimal difference being stored as a calibration offset in the non-volatile memory.

8. The integrated circuit of claim 1, further comprising counters for determining the first amount of time and the second amount of time.

9. The integrated circuit of claim 8, wherein said counters are configured to start counting when a trigger voltage is reached and to stop counting when the voltage threshold is reached.

10. The integrated circuit of claim 1, further being configured to:
   determine a third amount of time within which a resulting voltage on the measurement capacitor reaches a further voltage threshold;
   determine a fourth amount of time within which a resulting voltage on the reference capacitor reaches said further voltage threshold;
   detect the change of the capacitance on the measurement capacitor using a difference between the third amount of time and the fourth amount of time.

11. A radio frequency identification, RFID, tag or a near field communication, NFC, tag comprising the integrated circuit of claim 1.

12. A measurement system comprising the integrated circuit of claim 1 and the measurement capacitor.

13. A tamper detection system comprising the measurement system of claim 12.

14. A measurement method, comprising:
   injecting, by means of a current source in an integrated circuit, a first current in a measurement capacitor, and determining a first amount of time within which a resulting voltage on the measurement capacitor reaches a voltage threshold;
   injecting, by means of said current source, a second current in a reference capacitor and determining a second amount of time within which a resulting voltage on the reference capacitor reaches said voltage threshold;
   detecting, by the integrated circuit, a change of the capacitance on the measurement capacitor using a difference between the first amount of time and the second amount of time, wherein the first amount of time is measured independently of the second amount of time.

15. The method of claim 14, wherein the integrated circuit injects the first current in the measurement capacitor simultaneously with injecting the second current in the reference capacitor.

16. The method of claim 14, wherein the first current is a configurable current and the second current is a constant current.

17. The method of claim 14, wherein the first current is configured such that a voltage slope on the measurement capacitor is substantially the same as a voltage slope on the reference capacitor.

18. The method of claim 14, wherein a value of the first current is determined when the integrated circuit is calibrated.

19. The method of claim 14, wherein the determined value of the first current is stored in a non-volatile memory of the integrated circuit.

20. The method of claim 14, wherein the determined value of the first current is a value that results in a minimal difference between the first amount of time and the second amount of time, said minimal difference being stored as a calibration offset in the non-volatile memory.

* * * * *